United States Patent [19]

Whitley

[11] 4,377,026

[45] Mar. 22, 1983

[54] SYSTEM FOR SECURING COMPONENT LEADS TO PRINTED CIRCUIT BOARDS

[75] Inventor: George J. Whitley, Philadelphia, Pa.

[73] Assignee: RCA Corporation, New York, N.Y.

[21] Appl. No.: 75,585

[22] Filed: Sep. 14, 1979

[51] Int. Cl.³ .......................... B23P 19/00; H05K 3/30
[52] U.S. Cl. ................................ 29/564.1; 29/566.3; 29/739; 29/838; 83/200; 140/105
[58] Field of Search .................... 29/33 M, 564.1, 739, 29/741, 742, 759, 760, 831, 832, 835, 837, 838, 566.3, 566.4; 140/105, 1; 83/199, 200, 580

[56] References Cited

U.S. PATENT DOCUMENTS

| | | | |
|---|---|---|---|
| 1,497,676 | 6/1924 | Fink | 83/580 X |
| 2,827,634 | 3/1958 | Kwasniewski | 29/741 X |
| 2,893,010 | 7/1959 | Stuhre | 140/1 X |
| 2,907,040 | 10/1959 | Woods . | |
| 3,389,629 | 6/1968 | Tamburr | 83/200 |
| 3,508,315 | 4/1970 | Hoffken | 29/741 X |
| 3,574,934 | 4/1971 | De Rose | 29/838 |
| 3,577,847 | 5/1971 | Scranton . | |
| 3,732,898 | 5/1973 | Boyer | 140/105 |
| 3,803,649 | 4/1974 | Skutt et al. | 29/566.3 X |
| 4,054,988 | 10/1977 | Masuzima et al. | 29/741 X |
| 4,153,082 | 5/1979 | Foley | 140/105 |
| 4,173,160 | 11/1979 | Hess | 83/580 X |

FOREIGN PATENT DOCUMENTS 1350924 4/1974 United Kingdom ................ 29/741

Primary Examiner—Z. R. Bilinsky
Attorney, Agent, or Firm—Samuel Cohen; William Squire

[57] ABSTRACT

When operating a system embodying the invention, the operator sits in a convenient position with his knees beneath the conveyor carrying the printed circuit boards. The tools for bending, cutting and otherwise operating on the components leads are located above the operator's lap, secured to the conveyor support structure. When a circuit board reaches a position in front of the operator, the board stops, the various bending, cutting or other special tools move into position, and the operator inserts the components the leads of which will extend beneath the circuit board in alignment with the tools. The leads of some components are bent by being forced against the sloped surface of a tool while the components are being inserted by the operator. The leads of others are bent and, if needed, cut by machine operated tools, actuated by the operator, after the components are inserted.

9 Claims, 12 Drawing Figures

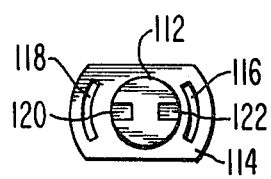
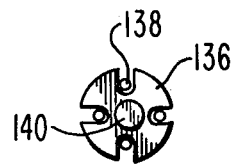
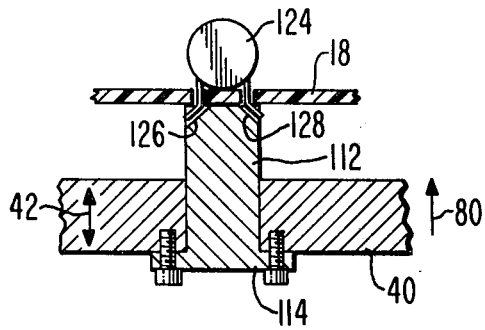
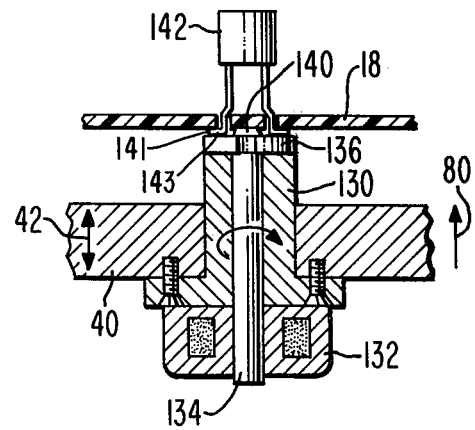
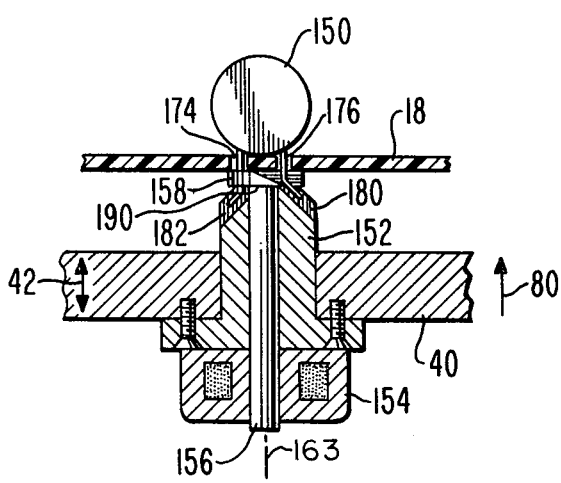
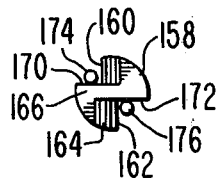
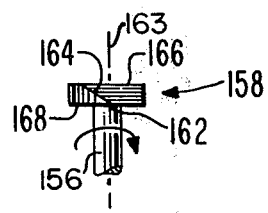

SYSTEM FOR SECURING COMPONENT LEADS TO PRINTED CIRCUIT BOARDS

The present invention relates to apparatus for permitting the efficient assembly of printed circuit boards and, more particularly, to apparatus for processing, i.e., bending, cutting or otherwise operating on the leads of components placed in the boards.

It is often necessary manually to insert various components into printed circuit boards during an assembly process. The boards may be on a long conveyor system with operators spaced along the length of the system. Each operator may be assigned a certain number of components which he inserts into holes at specific locations on the board. After the board passes the last operator, presumably with all of the components in place, the leads extending through the circuit board are soldered to the printed conductors on the underside of the board. This can be accomplished by passing the board through a solder bath.

In a more modern approach to the assembly process, rather than using a single conveyor system, a plurality of small conveyor loops may be employed with a single operator station at each loop. The movement of each loop is under control of the operator of that loop and this permits the operators to work at somewhat different speeds. After an operator completes the insertion of the components into a board and starts up the conveyor of the loop again, that board automatically transfers to the next loop when it reaches the next loop.

A problem which is present in the systems described above is that during movement, either of the single long conveyor or movement of the boards from one small loop conveyor to the following loop conveyor, the components sometimes work their way loose, that is, the leads become displaced from the holes in which they were inserted, permitting the component to fall out. The missing component may not be detected until after the soldering process is completed. The board, of course, will not operate properly with any of the components missing so that the board has to be reworked. This is a costly process and may involve the manual removal of solder from holes in the board in addition to the re-insertion of a component and the soldering of that component in place.

It is preferable after a component is inserted in a board, that it be securely held in place. This can be accomplished by the operator by bending and, if needed, cutting and otherwise "processing" the leads of the components which extend from the underside of the board after each component is inserted. The apparatus for performing such functions under control of the operator may be relatively bulky and may occupy a significant portion of the space beneath the conveyor. This prevents the operator from sitting in a convenient position, that is, with his knees beneath the conveyor. If the operator is seated in a less convenient position, he has to remove the circuit board from the conveyor, then manually insert the components and process their leads, and then he must reposition the circuit board on the conveyor. This is slow, relatively inefficient, and therefore relatively expensive.

When using apparatus embodying the present invention, the operator sits in a convenient position with his knees beneath the conveyor. The apparatus for bending and/or cutting and so on, the leads of components placed in the printed circuit board is located in the space between the operator's lap and the underside of the printed circuit board. The apparatus includes a tool supporting structure and tools secured to the structure including elements which align with the leads of the components when they are inserted into the board. The tool supporting structure is caused to move from a first position beneath and spaced from the circuit board to a second position adjacent the board. When in the second position, the leads of the components may be processed as they are placed in the board.

Figure 2:
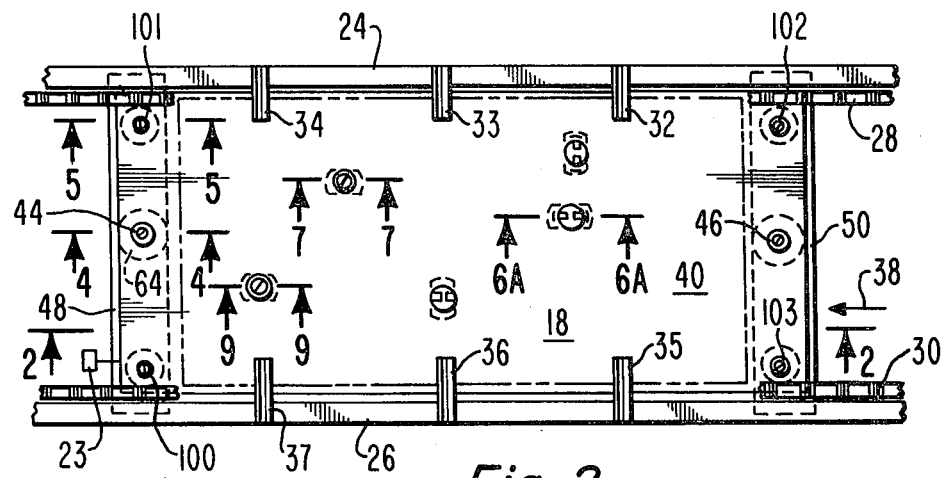
FIG. 2 is a plan view of the apparaus of FIG. 1.
Figure 3:
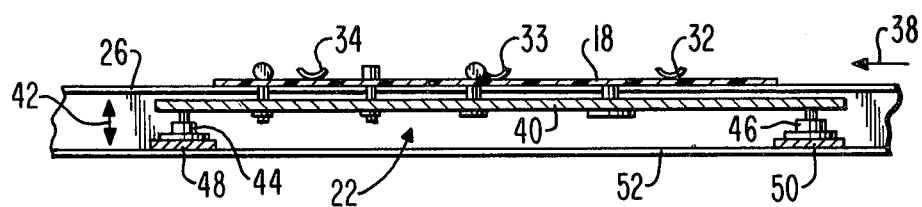
Figure 4:
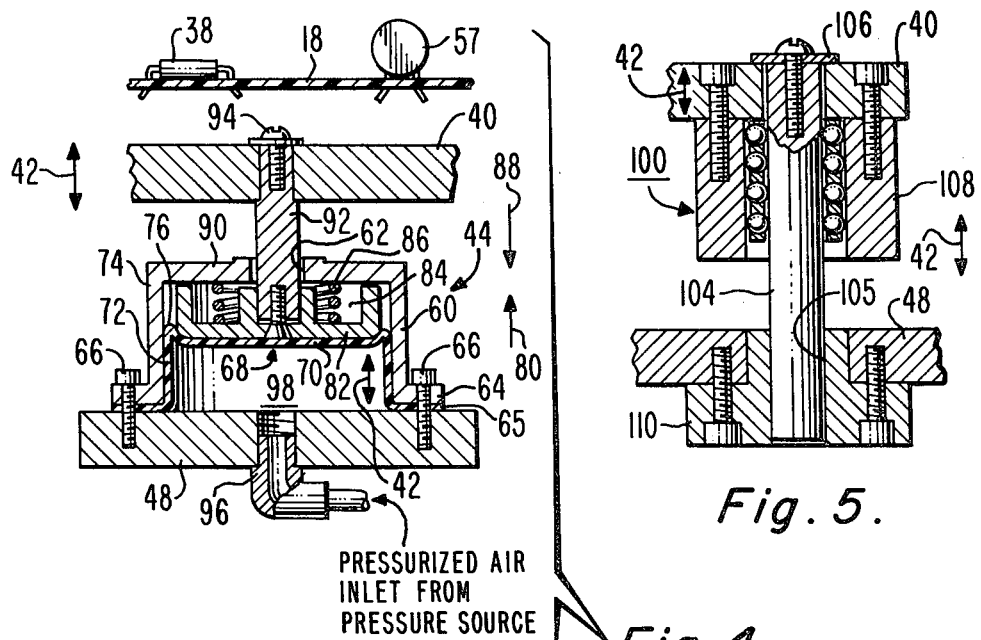
Figure 5:
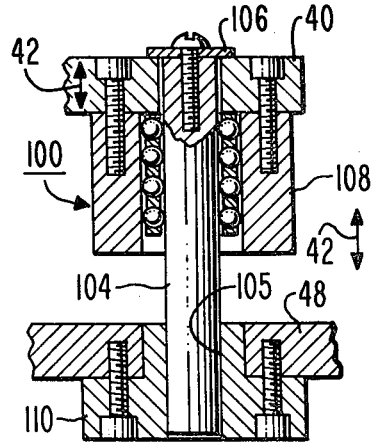

FIG. 3 is a side sectional view of the apparatus of FIG. 2 taken along lines 2—2, FIG. 4 is a sectional view through one of the pistons of FIG. 2 taken on lines 4—4 of FIG. 2, FIG. 5 is a sectional view taken along lines 5—5 of FIG. 2, FIG. 6A is a side sectional view of the apparatus of FIG. 2 taken along lines 6—6, FIG. 6B is a plan view of the device of FIG. 6A (with plate 40 not present), FIG. 7 is a sectional view of the device of FIG. 2 taken along lines 7—7, FIG. 8 is a plan view of the lead forming tool of FIG. 7, FIG. 9 is a sectional view of a lead forming device taken along lines 9—9 of FIG. 2, FIG. 10 is a plan view of the cutting head of the device of FIG. 9, and FIG. 11 is a side view of the cutting head of the device of FIG. 9.

Figure 1:
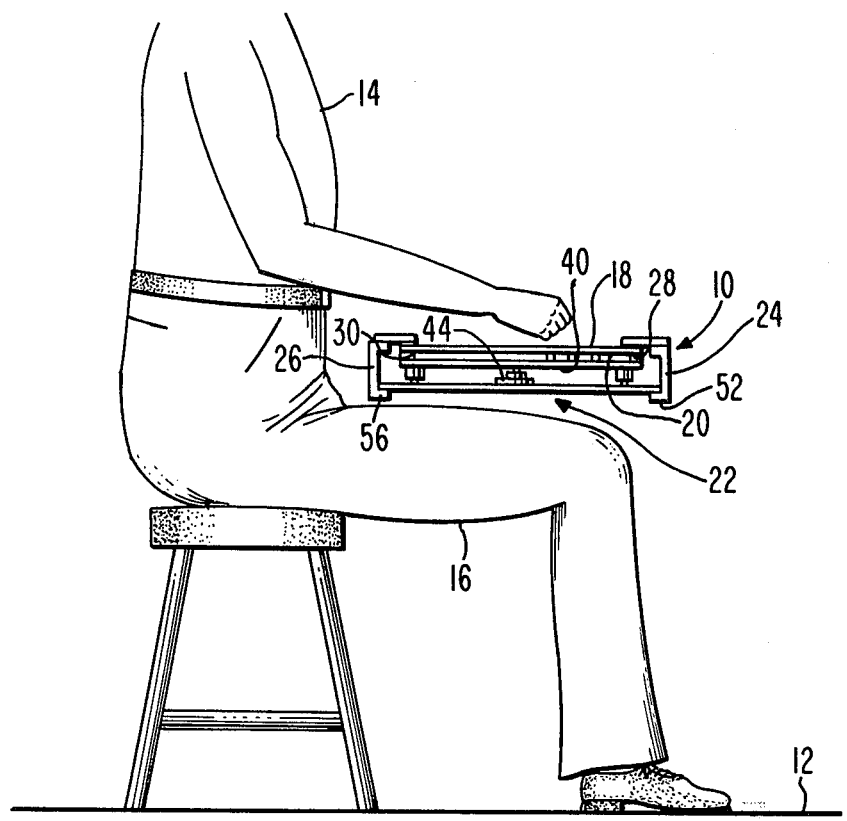
FIG. 1 is an end sectional view through an apparatus embodying the present invention.

In FIG. 1 a printed circuit board conveyor 10 is mounted in spaced relationship with respect to floor 12. This conveyor, in the form of a small loop, may be one of a large number, such as 20 or more such loops (not shown) spaced end to end. Each loop is under control of a single operator 14, shown seated at the assembly station of that loop, with legs 16 beneath the conveyor. Means, not shown, are provided for automatically transferring circuit boards from a preceding loop of the conveyor system to the one shown in part in FIG. 1, and from the one shown to the succeeding loop of the system. As these are not directly involved in the present invention, they will not be further described. The conveyor 10 transports a printed circuit board 18 in a direction into the drawing. When the board reaches the operator's position (the assembly station) a microswitch is actuated by the board and the conveyor (and board) automatically stop. Immediately therewith an underneath apparatus moves upward until its forming tools (to be described later) simultaneously contact the underneath side of the printed circuit board. The operator then manually inserts components, such as resistors, capacitors, and other electrical devices on the upper surface of the printed circuit 18.

The leads of the components, as will be shown, pass through various insertion apertures in the circuit board and are in alignment with various tools of the apparatus at the operator's station, indicated generally by the arrow 22. The tools are for bending, cutting and otherwise operating on the parts of the leads extending beneath the underside 20 of the printed circuit board 18. The apparatus 22 is mounted to the conveyor 10 in a stationary position just above the operator's legs 16 at the assembly station.

In operation, the conveyor 10 transports the printed circuit board 18 in the direction into the drawing. As already mentioned, the conveyor loop shown in part is under the control of one operator who is seated as shown in FIG. 1, and this is the only operator for this loop. When the conveyor moves the circuit board in front of the operator and in alignment with certain tools (such as shown in FIGS. 6–11 which are discussed later), switch 23 (FIG. 2) mounted on the conveyor support structure senses the board 18 position and stops the conveyor and the board 18 in the desired position. This switch 23 also operates the apparatus 22 to place its tools in a lead bending and operating position as discussed later. This action also accurately aligns the tools with the board 18 at this time by inserting guide pins (not shown) in guide apertures (not shown) in the board. The operator then inserts the components in the stationary circuit board while the board remains on the conveyor. The leads of the components extend beneath the underside of the board and align with slots, blades, etc., of the various tools, designated by arrow 22, as discussed later. Certain of the leads engage some of the tools and become bent in response to the manual force exerted by the operator when he forces the component into position. With respect to other of the components, after each one is inserted, the operator holds that component in place while actuating a first control button (not shown) which operates the rotary solenoid actuated tools of the apparatus 22. Such a tool, for example, may cut and bend the leads of the held component, that is, portions of the leads passing through the underside 20 of the printed circuit. This and other operations are discussed later. After the "processing" of the leads of all of the components inserted by a particular operator, he actuates a second control button (not shown) to place the apparatus in an idle position, that is, to lower plate 40, as will be described in more detail, and a third control button (not shown) to start the conveyor moving which brings the next printed circuit board into position and which moves the completed circuit board to the succeeding conveyor loop (not shown).

Conveyor 10 comprises two facing elongated channel members 24 and 26. Members 24 and 26 extend into and out of the drawing. Member 24 is adjustable (by means not shown) in a direction to the left and right of FIG. 1 to provide close spacing between board 18 and members 24 and 26. These members serve to guide and align the board 18 in the desired direction. A minimum clearance is provided with the board to permit it to be carried by the conveyor. Members 24 and 26 are supported on the floor 12 by supports (not shown). Mounted adjacent each channel member 24 and 26 are respective sprocket driven conveyor chains 28 and 30 which run horizontally parallel to the floor 12. Drive sprockets, drive motors and related drive apparatus drive the chains 28 and 30. Such drive apparatus is well known and need not be described in detail herein. Printed circuit board 18 rests on the upper surface of the chains 28 and 30. Resiliently urging the printed circuit board 18 against the upper surfaces of the chains 28 and 30 are a plurality of cantilevered springs 32–37, FIG. 2.

The springs 32–37 are identical. Each is arcuate in end view, as shown in FIG. 3, and is mounted at one end to the upper surface of a channel 24 or 26, associated therewith. The springs permit the printed circuit board 18 readily to move with the conveyor in the direction 38 and provide sufficient resilient force against the upper surface of the board 18, in a downward direction, to hold the board in place.

In FIG. 3, the apparatus 22 comprises a rectangular plate 40, mounted for vertical displacement in the directions 42 on two air cylinders 44 and 46, described in detail later, at opposite ends of the plate 40. The air cylinders 44 and 46 are mounted respectively on cross braces 48 and 50. Braces 48 and 50 rest on the inner surface of the lower legs 52 and 56, respectively, of the channel members 24 and 26 and may be welded, bolted or otherwise fastened to the legs. The cylinders 44 and 46 are preferably air operated devices as will be explained in more detail in connection with FIG. 4. Other devices which may provide the desired motions in the limited space between the legs 52 and 56 and the underside of the printed circuit board 18, may be used instead.

This limited space, which may be about 4 inches in height, must provide sufficient clearance for the passage of the printed circuit board for the lead processing apparatus, and for the bending, cutting and other processing of the component leads when the apparatus is operated. It is important that the apparatus does not extend below the channel legs 52, 56 because if it did, it would interfere with the legs 16 of the operator. Therefore, any solenoids used in place of the air operated exemplary cylinders 44 and 46 would have to fit within the limited clearance space available. Additionally, its bulk would have to be sufficiently small to permit the displacement of the operating mechanism for the purpose of trimming and deforming the leads as will be explained.

In FIG. 4, the printed circuit board 18 is shown to have a capacitor 57 and a resistor 38 mounted thereon by way of example. The plate 40 is shown in its actuated upward position spaced from and beneath the printed circuit board 18. The forming tools of FIGS. 6A, 6B, 7–11 are in contact with the component leads projecting through the under side of the board.

Cylinder 44 comprises an inverted metal cup 60 having a centrally disposed guide aperture 62. Peripheral flange 64 is secured to the barce 48 by screws 66. Inverted thin walled, flexible rubber cup 68 is mounted concentric with the cup 60. Cup 60 and rubber cup 68 are generally circular. They could have other shapes instead. Rubber cup 68 has a flange 65 coextensive with flange 64. Flange 65 is compressed between flange 64 and brace 48 to form a seal therewith. Cup 68 has an upper wall integral with the cylindrical side wall 72. The side wall 72 is in physical contact with the side wall 74 of the outer cup 60. An upward facing bight 76 connects the wall 70 to the side wall 72.

Mounted on the upper surface of the wall 70 is a metal element 82 which has an annular groove 84 for receiving a compression coil spring 86. Spring 86 urges the element 82 against the wall 70 in the downward direction 88 with respect to wall 90 of cup 60, the walls 74 and 90 being rigid. Mounted to the central part of the element 82 is upstanding post 92 secured at its upper end to plate 40 by screw 94. Air inlet conduit 96 is in fluid communication with the volume 98 between the cup 68 and brace 48. Conduit 96 is connected to a source (not shown) of pressurized air.

While the conveyor is operating and the board moving, the element 82 is in its lowermost position (not shown) in response to the pressure of spring 86. The air pressure in the volume 98 at this time is ambient air pressure. After the conveyor is stopped and before the operator has inserted the components, the switch 23

(FIG. 2) causes pressurized air to be supplied to the volume 98. This causes the wall 70, element 82 and plate 40 to be displaced upwardly in direction 80 toward the printed circuit board 18 as shown in FIG. 4 overcoming the force of spring 86.

The cylinder 46 is identical to cylinder 44.

Located at the four corners of plate 40 are guide assemblies 100-103. The assemblies 100-103 are identical and only one will be described. In FIG. 5 assembly 100 comprises a guidepost 104 which is screwed at its upper end to a washer 106. Screwed to plate 40 is a bearing assembly 108. The balls of the bearing assembly 108 rests against the post 104 to provide relatively frictionless motion for the guidepost 104 as the bearing assembly moves in directions 42. The guidepost 104 is secured in aperture 105 in sleeve 110, which is screwed to brace 48.

When the plate 40 is caused to move in directions 42 by operation of the cylinders 44 and 46, plate 40 and the bearing assembly 108 move up and down vertically over the guidepost 104 which remains fixed. In FIG. 5 the plate 40 is shown at its uppermost position against washer 106 which acts as a stop for the plate 40. This controls precisely the upward distance traversed by the plate 40 in performing its function.

Mounted to plate 40 are a plurality of lead bending and trimming devices as illustrated in FIGS. 6A through 11. These devices bend and trim, where applicable, leads of electrical components to be inserted in apertures in the board 18. The components are inserted by the operator manually.

Guide pins (not shown) are secured to the upper surface of plate 40 and are adapted to be inserted in guide apertures (not shown) in the circuit board 18. When the board 18 is stopped by switch 23 and plate 40 moves to its upper position, these guide pins are aligned with and are inserted in the guide apertures of the board 18 by the vertical movement of plate 40. This action accurately aligns the component lead apertures in the board 18 with the bending and trimming devices secured to plate 40.

FIG. 6A illustrates a capacitor lead bending device. The cylindrical shaft 112 is screwed to the plate 40 by way of flange 114. Flange 114 has elongated slots 116 and 118 for orienting the device. The upper end of shaft 112 has two diametrically opposite tapered grooves 120 and 122. Grooves 120 and 122 serve to receive the vertically oriented downward depending leads of the capacitor 124 and deflect the leads radially outwardly as they are being inserted by the operator and as shown in FIG. 6A by means of sloping surfaces 126 and 128 on the base of the respective grooves 120 and 122.

In operation of the device of FIG. 6A, after the plate 40 is traversed upwardly in the direction 80 to the position shown, the leads of the capacitor 124 are inserted in the printed circuit board and engage designated holes in the grooves 120 and 122. The force exerted by the operator causes the leads to travel along the sloping surfaces 126 and 128 and to become bent outwardly, as shown. The leads of these and all other components which are processed in this way are relatively thin wires which are easily bent by manual force.

FIGS. 7 and 8 illustrate an apparatus for bending the thicker leads of a can-type transistor against the circuit board underside surface. It includes an upstanding bearing post 130 secured to plate 40 by screws. A rotary solenoid 132 is mounted on the lower end of post 130. Passing through post 130 and solenoid 132 is the solenoid shaft 134 which has a lead deforming end 136. The shape of end 136 is shown in more detail in FIG. 8. End 136 comprises a cylinder with four diagonally opposite U-shaped slots 138. A small boss 140 protrudes above the end 136 to provide spacing 141 to the circuit board underside.

A three or four leaded transistor 142 is inserted in the printed circuit board 18 by the operator at the assembly station of FIG. 1. The leads from the transistor 142 are relatively long and extend downwardly in straight lines. Each lead from the transistor 142 is aligned with a separate, different slot 138 with the plate 40 in its uppermost position.

Upon actuation of the cylinders 44 and 46 of FIGS. 2 and 3, prior to the insertion of transistor 142 in board 18, the plate 40 is raised in direction 80 to the position of FIG. 7, forcing the boss 140 at end 136 in abutment with printed circuit board 18 spacing the end 136 from board 18 at 141. The operator inserts the transistor, holds it in position, and then presses a control button (not shown). This causes a signal to be applied to the rotary solenoid 132, which rotates the shaft 134 and tool end 136 approximately 45°. The tool end 136, when it rotates through 45°, bends the leads in the slots 138 against the underside of board 18 as shown in FIG. 7 forcing the bent lead ends 143 into the space 141. The solenoid automatically returns to its starting position immediately after reaching its 45° rotation position.

In FIGS. 9, 10 and 11 is shown a capacitor lead trimming and bending device. Bearing post 152 is mounted to plate 140. A rotary solenoid 154 is mounted to the lower surface of the bearing post 152. Rotary solenoid shaft 156 is inserted in the bearing aperture of post 152 and rotary solenoid 154. A lead bending and trimming tool 158 is mounted on the upper end of shaft 154. The tool 158 is shown in more detail in FIGS. 10 and 11. The tool 158 is a disc-like member with two cutting edges 160 and 162 formed by a tapered wall 164 which tapers from the upper surface 166 to the lower surface 168 of the disc. The cutting edges 160 and 162 form with side walls 170 and 172 V-shaped oppositely disposed grooves in plan view for receiving the leads 174 and 176 of capacitor 150.

With the plate 40 in its upper position, the capacitor 150 whose leads are to be trimmed is inserted into printed circuit board 18. The leads 174 and 176 are relatively long straight members at this time. Lead 174 is inserted in the holes in the printed circuit board and into the grooves in post 152. Just beneath the cutting edges 160 and 162 in the post 152 are a pair of grooves or holes 180 and 182 which receive the leads 174 and 176 respectively. The grooves or holes 180 and 182 extend radially outwardly and downwardly from the tool 158 position.

In FIG. 9, the leads 174 and 176 extend into the grooves 180 and 182 adjacent to cutting edges 160 and 162 of tool 158. In operation, while the operator is holding capacitor 150 in place to prevent it from being ejected from the board in response to the cutting operation, he presses a control button. This causes a control signal to be supplied to the rotary solenoid 154 and it rotates the tool 158 about the axis of rotation 163 of shaft 156 approximately 90° (and then returns it to its original position) cutting the ends of leads 174 and 176. Preferably all the rotary solenoids are actuated by a common control button. Tapered wall 164 of the cutting edge bends the leadover against the printed circuit board as the tool 158 is rotated approximately 90°. The tool 158 is then automatically rotated in the reverse direction to its start position. This reverse action is conventional in this type of solenoid. Cutting edges 160 and 162 form a scissor-like action with the upper surface 190 of the bearing post 152.

The tools of FIGS. 6A, 7 and 9 represent basic tools for bending and/or cutting the leads of most electronic components. While capacitors and transistors are illustrated, the leads of resistors, coils and other types of components can be processed in the same way by the devices illustrated. These devices may be custom made for each particular component, that is, for each kind of lead and each spacing between leads. For example, for long resistors in which leads are spaced relatively long distances apart, a tool specially designed for that resistor may be constructed and attached to plate 40 at the location corresponding to that resistor. A universal assembly may be made by assembling a variety of lead bending devices similar to those shown in FIGS. 6A, 7 and 9 to the plate 40 at various predetermined positions thereon. In the alternative, the devices of FIGS. 6A, 7 and 9 may be attached to a plate 40 for a given printed circuit board component layout and a new assembly constructed for each different kind of circuit board. It should be remembered that a printed circuit board of the type concerned is produced in large quantities making it economical to specially build a tool for that printed circuit board.

The tools for FIGS. 6A, 7 and 9 have relatively short dimensions in the vertical direction to fit the 4 inch space discussed above. While particular tools have been illustrated in connection with FIGS. 6A, 7 and 9, it will occur to those of ordinary skill that tools of these shapes may be used for components with different lead configurations.

For example, transistors with three leads or components with more than four leads may also be bent with the suitable tools appropriately designed to fit those leads.

What is claimed is:

1. In an apparatus including conveying means for supporting and transporting a printed circuit board, apparatus for processing leads of components inserted in apertures in said board while on said conveying means and positioned over the lap of an operator comprising:
   support means,
   vertical displacement means mounted on said support means,
   a horizontal member mounted on said displacement means for displacement in a vertical path,
   component lead processing means secured to said member, and
   displacement means operating means for displacing said member and said processing means toward said printed circuit board with said processing means aligned with said apertures, said support means, displacement means, member and processing means having a maximum vertical height of a few inches below said circuit board, said processing means including lead cutting means for trimming said leads, and said cutting means including a bearing member mounted to said horizontal member, a rotatable shaft within said bearing member, drive means for rotating said shaft in opposite angular directions secured to the bearing member while said processing means is displaced toward said printed circuit board, and a straight edge lead cutting and bending means on an end of said shaft and rotatable therewith for rotating said straight edge cutting and bending means in a plane normal to said shaft and parallel to said board.

2. In an apparatus including conveying means for supporting and transporting a printed circuit board, apparatus for processing leads of components inserted in apertures in said board while on said conveying means and positioned over the lap of an operator comprising:
   support means,
   vertical displacement means mounted on said support means,
   a horizontal member mounted on said displacement means for displacement in a vertical path,
   component lead processing means secured to said member, and
   displacement means operating means for displacing said member and said processing means toward said printed circuit board with said processing means aligned with said apertures, said support means, displacement means, member and processing means having a maximum vertical height of a few inches below said circuit board, said processing means including lead cutting means for trimming said leads, said cutting means including a horizontally rotatable disc member with at least two oppositely disposed V-shaped grooves and a horizontally oriented substantially straight cutting edge formed by a side wall of each groove, said side wall tapering from said cutting edge of said wall to the opposite edge of said wall, said disc being rotated in opposite directions while said processing means is displaced toward said printed circuit board.

3. In a system which includes conveyor means for transporting in a horizontal direction printed circuit boards which include holes into which it is desired to insert the leads of circuit components and then bend, cut or otherwise operate on the portions of these leads which extend through the board, the improvements which comprise:
   conveyor means,
   a tool supporting structure mounted to the conveyor means which is capable of moving between a first position beneath and spaced from the circuit board, when the latter is on the conveyor means, to a second position substantially closer to the circuit board when the latter is on the conveyor means, the tool supporting structure being located vertically within several inches from said conveyor means, and
   tools secured to the tool supporting structure, also within said several inches from said conveyor means, the tools including elements which align with the component lead holes, when the board is on said conveyor means, whereby when said tool supporting structure is caused to move to its second position and the leads inserted in the holes, the leads engage the tools and the tools can operate on these leads, one of said tools including a bearing member mounted to said support structure, a rotatable shaft within said bearing member, drive means for rotating said shaft in opposite directions in said second position secured to the bearing member, and lead trimming and bending means on an end of said shaft.

4. In a system which includes conveyor means for transporting in a horizontal direction printed circuit boards which includes holes into which it is desired to insert the leads of circuit components and then bend, cut or otherwise operate on the portions of these leads which extend through the board, the improvements which comprise:

conveyor means, a tool supporting structure mounted to the conveyor means which is capable of moving between a first position beneath and spaced from the circuit board, when the latter is on the conveyor means, to a second position substantially closer to the circuit board when the latter is on the conveyor means, the tool supporting structure being located vertically within several inches from said conveyor means, and tools secured to the tool supporting structure, also within said several inches from said conveyor means, the tools including elements which align with the component lead holes, when the board is on said conveyor means, whereby when said tool supporting structure is caused to move to its second position and the leads inserted in the holes, the leads engage the tools and the tools can operate on these leads, said elements including means for bending and trimming leads, of components, said means for trimming including a rotatable disc member with a pair of V-shaped openings for respectively receiving a pair of leads, a straight cutting edge on one wall of each said openings for trimming said pair of leads when the disc member is rotated, and means for rotating said disc member in opposite directions to sever the ends of said leads while said structure is in said second position.

5. In a system which includes conveyor means for transporting in a horizontal direction printed circuit boards which include holes into which it is desired to insert the leads of circuit components and then bend, cut or otherwise operate on the portions of these leads which extend through the board, the improvements which comprise:

conveyor means, a tool supporting structure mounted to the conveyor means which is capable of moving between a first position beneath and spaced from the circuit board, when the latter is on the conveyor means, to a second position substantially closer to the circuit board when the latter is on the conveyor means, the tool supporting structure being located vertically within several inches from said conveyor means, and tools secured to the tool supporting structure, also within said several inches from said conveyor means, the tools including elements which align with the component lead holes, when the board is on said conveyor means, whereby when said tool supporting structure is caused to move to its second position and the leads inserted in the holes, the leads engage the tools and the tools can operate on these leads, one of said elements including a rotatable disc having a set of slots each having a lead cutting edge for receiving a plurality of component leads, said slots extending toward the center of the disc, from the periphery thereof, and drive means for rotating said one elements in opposite directions after said supporting structure is moved to its second position.

6. A component lead cutting and bending tool comprising:

a shaft, a disc-like cutting member secured to the end of the shaft, said shaft for rotating said member in the plane of the disc about the shaft axis, said member being formed with at least one opening therein extending between the periphery and the center portion of the member, the opening being defined by two walls, one of said walls being tapered to form a straight cutting edge at one surface of the disc-like member, said edge extending between the center portion of said member to, and terminating at, the peripheral edge of said member, said tapered wall being sufficiently thick to engage and bend a cut lead, a support having an anvil surface abutting said one surface of said disc-like member, said support having at least one opening therein located to receive a lead to be cut which is placed in the opening of the disc-like member, and means for rotating said shaft in one angular direction immediately followed by rotation in the opposite direction and thereby said member secured thereto about said axis, whereby said cutting edge engages said anvil surface and said tapered wall engages said lead as said member rotates to cut and bend said lead in the one direction.

7. The tool of claim 6 wherein said member has circular outer edges and includes a plurality of like lead cutting edges, said support having a like plurality of lead receiving openings in said anvil surface.

8. The tool of claim 6 further including projection means on said member center portion projecting in a direction away from said anvil surface, said projection means for spacing the disc-like member from the surface of a board which mounts elements having leads to be cut which extend from said board surface.

9. The tool of claim 6 further including at least one additional opening in the disc-like member of the same shape as the first-mentioned opening, each disc-like member opening being of V shape, the nadir of the V being at the center portion of the member, each opening having a corresponding straight cutting edge, and said anvil surface having a corresponding plurality of lead receiving openings in positions corresponding to the positions of the openings in said disc-like member.

* * * * *